(12) United States Patent
Shigematsu

(10) Patent No.: US 11,135,700 B2  
(45) Date of Patent: Oct. 5, 2021

(54) PROCESSING APPARATUS FOR PROCESSING WAFER

(71) Applicant: DISCO CORPORATION, Tokyo (JP)

(72) Inventor: Koichi Shigematsu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 505 days.

(21) Appl. No.: 16/126,520

(22) Filed: Sep. 10, 2018

(65) Prior Publication Data

US 2019/0076986 A1 Mar. 14, 2019

(30) Foreign Application Priority Data

Sep. 13, 2017 (JP) .............................. JP2017-175971

(51) Int. Cl.
| | |
|---|---|
| B24B 41/00 | (2006.01) |
| B24B 49/12 | (2006.01) |
| B24B 7/22 | (2006.01) |
| H01L 21/304 | (2006.01) |
| H01L 21/66 | (2006.01) |
| H01L 21/67 | (2006.01) |
| H04N 5/33 | (2006.01) |
| H04N 7/18 | (2006.01) |

(52) U.S. Cl.
CPC .............. *B24B 49/12* (2013.01); *B24B 7/228* (2013.01); *B24B 41/005* (2013.01); *H01L 21/304* (2013.01); *H01L 21/67092* (2013.01); *H01L 22/26* (2013.01); *H04N 5/33* (2013.01); *H04N 7/183* (2013.01); *H01L 21/67253* (2013.01)

(58) Field of Classification Search
CPC ..... B24B 37/005; B24B 37/042; B24B 37/10; B24B 49/10; B24B 49/12; B24B 7/22; B24B 7/228; H01L 22/26; H01L 21/304
USPC .................. 451/10, 11, 285, 287, 41, 5, 6, 8
See application file for complete search history.

(56) References Cited

U.S. PATENT DOCUMENTS

| | | | |
|---|---|---|---|
| 8,247,773 B2 * | 8/2012 | Sasaki | G06K 9/2036 |
| | | | 250/339.11 |
| 10,096,500 B2 * | 10/2018 | Barker | G06K 7/1404 |
| 2007/0187514 A1 * | 8/2007 | Sasaki | G06K 7/10712 |
| | | | 235/462.39 |
| 2016/0059375 A1 * | 3/2016 | Ito | B24B 37/013 |
| | | | 382/141 |

FOREIGN PATENT DOCUMENTS

| | | | | |
|---|---|---|---|---|
| JP | H10284449 A | * | 10/1998 | ........... G06K 7/1404 |
| JP | 2013226625 A | | 11/2013 | |

\* cited by examiner

*Primary Examiner* — Lee D Wilson  
*Assistant Examiner* — Arman Milanian  
(74) *Attorney, Agent, or Firm* — Greer, Burns & Crain, Ltd.

(57) ABSTRACT

A processing apparatus includes a processing unit grinding or polishing the reverse side, which is exposed upwardly, of a wafer, an infrared camera unit capturing an image of the wafer from the reverse side thereof and acquiring an image including the face side of the wafer, an information register having information on a pattern of structural objects which a wafer to be processed is to have on the face side, registered therein, and a determining unit determining that the wafer to be determined is a wafer to be processed if the pattern of structural objects which a wafer to be processed is to have on the face side is found on the wafer to be determined before being processed by the processing unit.

6 Claims, 3 Drawing Sheets

PROCESSING APPARATUS FOR PROCESSING WAFER

BACKGROUND OF THE INVENTION

Field of the Invention

The present invention relates to a processing apparatus for processing a wafer of a semiconductor material.

Description of the Related Art

In a process of manufacturing device chips for use in electronic equipment such as mobile phones, computers, etc., a plurality of devices such as ICs (Integrated Circuits), LSI (Large-Scale Integrated) circuits, or the like are initially formed on the face side of a wafer of a semiconductor material. Then, the reverse side of the wafer is ground to thin the wafer to a predetermined thickness, and the wafer is divided into individual device chips. The wafer is ground by a grinding apparatus. The grinding apparatus includes a chuck table for holding the wafer thereon and a grinding unit for grinding the wafer on the chuck table. The grinding unit includes a spindle and a grinding wheel mounted on the lower end of the spindle. Grinding stones are mounted on the lower surface of the grinding wheel. When the grinding wheel and the chuck table that is holding the wafer thereon are rotated about respective rotational axes thereof that are substantially parallel to each other and the grinding wheel is lowered to bring the grinding stones into contact with the wafer, the wafer is ground by the grinding stones.

When a reverse side of the wafer is ground by the grinding stones, minute recesses and projections are formed on the ground reverse side of the wafer, and the formed fractured layer in the wafer tends to lower the flexural strength of device chips. Therefore, the ground reverse side of the wafer is polished to remove the recesses and projections and the fractured layer therefrom. A polishing apparatus for polishing a wafer includes a chuck table for holding the wafer thereon and a polishing pad for polishing the wafer. When the polishing pad and the chuck table that is holding the wafer are rotated about respective rotational axes thereof that are substantially parallel to each other and the polishing pad is lowered into contact with the wafer, the wafer is polished by the polishing pad.

Wafers may be ground and polished by an apparatus which functions as both the grinding apparatus and the polishing apparatus (see, for example, Japanese Patent Laid-open No. 2013-226625). The apparatus includes a grinding wheel and a polishing pad, and grinds a wafer with the grinding wheel and polishes the ground wafer with the polishing pad. According to these processing apparatus, the chuck table holds the face side, where devices are formed, of the wafer, exposing the reverse side, where no devices are formed, of the wafer upwardly, and the reverse side of the wafer is processed under processing conditions input to the processing apparatus in advance. The processing conditions are appropriately selected depending on the type of the wafer, the type of device chips to be formed, and so on. The processing conditions input to the processing apparatus include, for example, the diameter and thickness of the wafer, the finished thickness of the processed wafer, the rotational speeds of the grinding wheel and the polishing pad, the rotational speed of the chuck table, the processing feed speed, etc.

SUMMARY OF THE INVENTION

In the processing apparatus, a wafer of a type not to be processed may be delivered to the chuck table for certain reasons. If the wafer of the type not to be processed is processed under the processing conditions input to the processing apparatus, then the wafer will not be processed as desired. It is therefore desirable to determine whether the wafer loaded into the processing apparatus is a wafer to be processed or not before the wafer is processed. Structural objects such as devices or the like are formed on the face side of the wafer, and the type of the wafer can be determined by observing the face side of the wafer and confirming the structural objects formed on the face side. However, since structural objects such as devices or the like are generally not formed on the reverse side of the wafer, it is difficult to determine the type of the wafer by observing the reverse side of the wafer that is held on the chuck table with the reverse side facing upwardly.

The present invention has been achieved in view of the above problems. It is an object of the present invention to provide a processing apparatus that is capable of determining whether a wafer introduced into the processing apparatus is a wafer to be processed or not.

In accordance with an aspect of the present invention, there is provided a processing apparatus for grinding or polishing a reverse side of a wafer which has structural objects on a face side thereof, including a chuck table holding the wafer with the face side facing downwardly, a processing unit grinding or polishing the reverse side, which is exposed upwardly, of the wafer held on the chuck table, a cassette support area supporting thereon a cassette housing the wafer therein, a delivery unit taking out the wafer from the cassette on the cassette support area and delivering the wafer to the chuck table, an infrared camera unit for capturing an image of the wafer from the reverse side thereof and acquiring an image including the face side of the wafer, an indicating unit indicating various items of information, and a control unit controlling the chuck table, the processing unit, the cassette support area, the delivery unit, the infrared camera unit, and the indicating unit, in which the control unit includes a determining unit determining whether the wafer to be determined which is taken out from the cassette on the cassette support area is a wafer to be processed or not, and an information register having information on a pattern of structural objects which a wafer to be processed is to have on the face side, registered therein, for sending the information to the determining unit when the determining unit determines, the infrared camera unit captures an image of the wafer to be determined before being processed by the processing unit from the reverse side thereof and acquires an image including the face side of the wafer, and if the pattern of structural objects which a wafer to be processed is to have on the face side is found in the acquired image, the determining unit determines that the wafer to be determined is a wafer to be processed, and if the pattern of structural objects which a wafer to be processed is to have on the face side is not found in the acquired image, the determining unit determines that the wafer to be determined is not a wafer to be processed and the indicating unit indicates the determined result from the determining unit.

Preferably, the infrared camera unit captures an image of the wafer to be determined over a route along which the wafer to be determined travels after being taken out of the cassette placed on the cassette support area until being held on the chuck table.

The processing apparatus according to the aspect of the present invention includes the infrared camera unit for capturing an image of the wafer from the reverse side thereof. In as much as the infrared camera unit can catch an infrared radiation transmitted through the wafer, the infrared camera unit can acquire an image including the face side of the wafer. The image includes, for example, structural objects such as devices, interconnects, electrodes, etc. on the face side of the wafer.

The processing apparatus includes the control unit that has the determining unit and the information register. The information register has information on a pattern of structural objects which a wafer to be processed is to have on the face side, registered therein. The determining unit controls the infrared camera unit to capture an image of the face side of the wafer to be determined and acquire an image including the face side of the wafer, and receives the information registered in the information register. If the pattern of structural objects which a wafer to be processed is to have on the face side is found in the image acquired by the infrared camera unit, then the determining unit determines that the wafer to be determined is a wafer to be processed. On the other hand, if the pattern of structural objects which a wafer to be processed is to have on the face side is not found in the image acquired by the infrared camera unit, then the determining unit determines that the wafer to be determined is not a wafer to be processed.

Consequently, the processing apparatus according to the aspect of the present invention is capable of determining whether a wafer introduced into the processing apparatus is a wafer to be processed or not.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
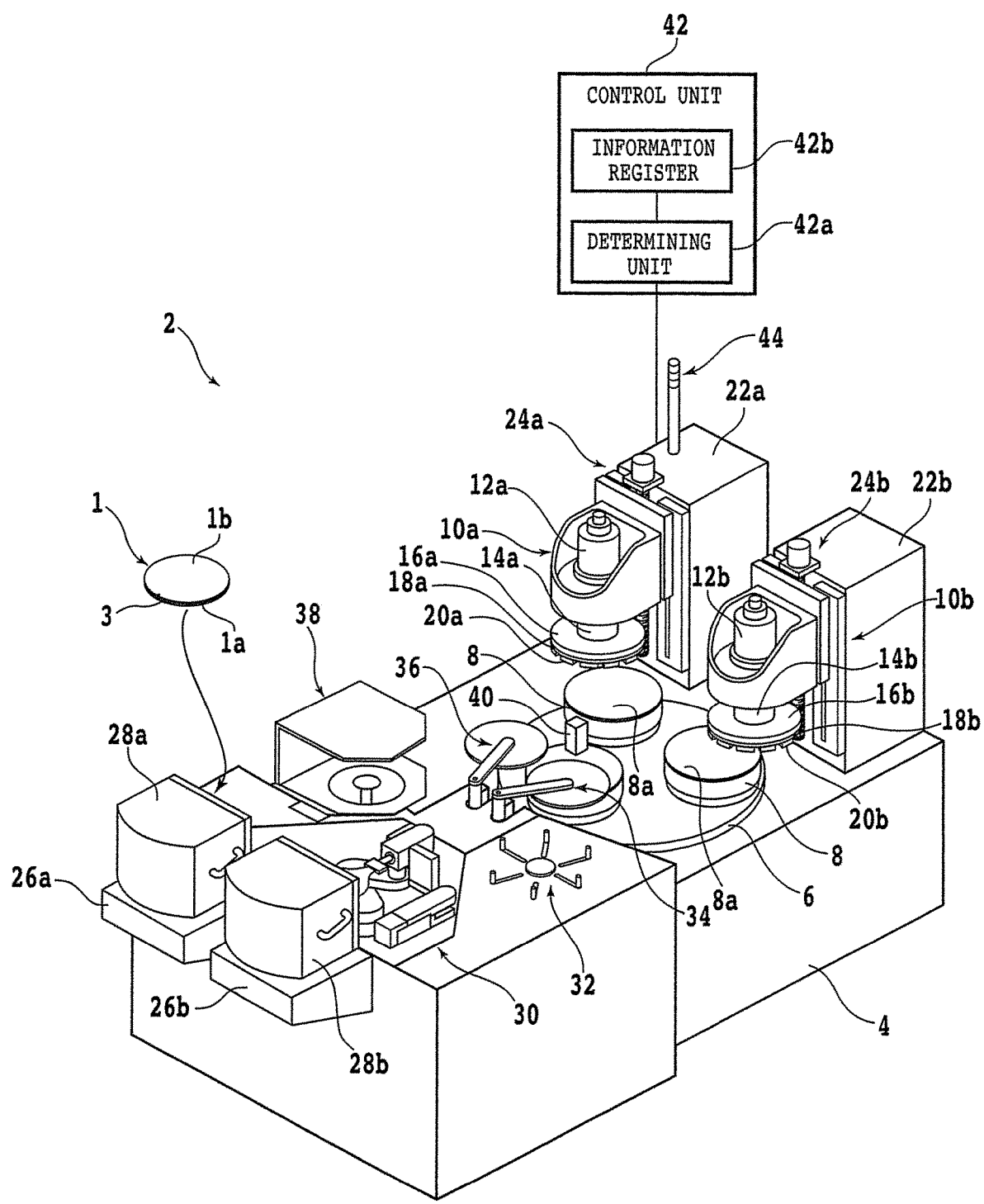
FIG. 1 is a perspective view schematically depicting the makeup of a grinding apparatus.

An embodiment of the present invention will be described below with reference to the drawings. A processing apparatus according to the present embodiment is a processing apparatus for processing a wafer made of a semiconductor material, such as silicon, SiC (silicon carbide), or the like that transmits at least certain infrared radiations therethrough. For example, the processing apparatus according to the present embodiment may be a grinding apparatus for grinding a wafer or a polishing apparatus for polishing a wafer. A grinding apparatus, for example, will hereinafter be described as the processing apparatus according to the present embodiment. FIG. 1 schematically depicts in perspective the makeup of a grinding apparatus 2 according to the present embodiment.

A wafer 1 made of a semiconductor material to be ground by the grinding apparatus 2 has a plurality of intersecting projected dicing lines on a face side 1a thereof. The projected dicing lines demarcate the face side 1a into a plurality of areas where a plurality of respective devices 5 (see FIG. 2B) such as ICs, LSI circuits, or the like are disposed. Interconnect layers, electrodes, etc. for supplying electric signals to and receiving electric signals from the devices 5 are also disposed on the face side 1a of the wafer 1. In other words, structural objects including the devices 5, the interconnects, the electrodes, etc. are disposed on the face side 1a of the wafer 1. A protective tape 3 is applied to the face side 1a of the wafer 1 to protect the devices 5 thereon.

The wafer 1 is irradiated with a laser beam having a wavelength that is transmittable through the wafer 1 along the projected dicing lines from the reverse side 1b thereof. The laser beam is focused at positions at a predetermined depth in the wafer 1, forming modified layers in the vicinity of the focused positions along the projected dicing lines by way of multiphoton absorption. When external forces are applied to the wafer 1 with the modified layers formed therein, cracks are developed in the wafer 1 from the modified layers in thicknesswise directions of the wafer 1. Thereafter, the reverse side 1b of the wafer 1 is ground and polished by the grinding apparatus 2, thinning the wafer 1 until the wafer 1 is divided into individual device chips carrying the respective devices 5 from the cracks along the projected dicing lines.

In recent years, the wafer 1 has had an increased size, e.g., 300 mm across, for example, in order to achieve an increased yield of device chips from the wafer 1 for higher productivity of device chips. The large-size wafer 1 has a relatively large thickness of 725 μm, for example, so that it is not easy to focus the laser beam applied to the wafer 1 from the reverse side 1b thereof at positions at a desired depth in the wafer 1 for forming modified layers therein. According to one solution, a pre-grinding process is carried out on the wafer 1 to grind the wafer 1 to a thickness in the range of 300 to 600 μm before the laser beam is applied to the wafer 1. After the pre-grinding process, the laser beam is applied to the wafer 1 to form modified layers therein, and then the wafer 1 is thinned to a predetermined finished thickness by the grinding apparatus 2.

The grinding apparatus 2 according to the present embodiment includes an infrared camera unit 40 that captures an image of the face side 1a of the wafer 1 from the reverse side 1b thereof before the reverse side 1b of the wafer 1 is ground. If the reverse side 1b of the wafer 1 is not flat but satin-finished, for example, the reverse side 1b tends to reflect an infrared radiation from the infrared camera unit 40, which hence may not be able to capture a clear image of the face side 1a. On the other hand, if the reverse side 1b is pre-ground, it is flat and is less likely to disperse an infrared radiation that is applied from the infrared camera unit 40 to capture an image of the face side 1a of the wafer 1 from the reverse side 1b thereof. Accordingly, it is desirable that the reverse side 1b of the wafer 1 be made flat or planarized before the infrared camera unit 40 captures an image of the face side 1a. However, the wafer 1 to be processed by the grinding apparatus 2 according to the present embodiment is not limited to a pre-ground wafer.

The grinding apparatus 2 will be described in detail below. As depicted in FIG. 1, the grinding apparatus 2 includes a base 4 on which a disk-shaped turntable 6 is rotatably mounted for rotation in a horizontal plane. The turntable 6 supports on its upper surface three chuck tables 8 that are angularly spaced apart by 120 degrees in the circumferential directions of the turntable 6. When the turntable 6 is turned about its own central axis, the chuck tables 8 are shifted into a wafer loading/unloading area, a rough-grinding area, and a finish-grinding area, after being shifted out of the areas in which they were previously positioned. When the turntable 6 stops being turned about its own central axis, the chuck tables 8 stay in the areas into which they have been shifted. In the wafer loading/unloading area, a wafer 1 to be ground is placed on one of the chuck tables 8 that is positioned in the wafer loading/unloading area, and a wafer 1 that has been ground is removed from the chuck table 8 positioned in the wafer loading/unloading area. In the rough-grinding area, a grinding unit (processing unit) 10a performs a rough-grinding process on a wafer 1 on the chuck table 8 positioned in the rough-grinding area at a high processing feed speed. In the finish-grinding area, a grinding unit (processing unit) 10b performs a finish-grinding process on a wafer 1 on the chuck table 8 positioned in the finish-grinding area for accomplishing higher planarity of the finish-ground surface of the wafer 1 than planarity of the rough-ground surface of the wafer 1.

Each of the chuck tables 8 has a suction channel, not depicted, defined therein that is connected at one end thereof to a suction source, not depicted, and connected at the other end thereof to a holding surface 8a that is provided as the upper surface of the chuck table 8. The holding surface 8a is made of a porous material. When the suction source is in operation, it develops a negative pressure that acts through the suction channel and the porous holding surface 8a on a wafer 1 placed thereon, so that the chuck table 8 holds the wafer 1 under suction thereon.

The grinding apparatus 2 also includes a pair of upstanding columns 22a and 22b on a rear end portion of the base 4 which support the grinding units 10a and 10b respectively on front sides thereof. The grinding units 10a and 10b have respective vertical spindles 14a and 14b extending vertically and having upper ends connected to respective spindle motors 12a and 12b, which rotate the spindles 14a and 14b about their own central axes. The grinding units 10a and 10b also have wheel mounts 16a and 16b, respectively, connected to the lower ends of the respective spindles 14a and 14b, and grinding wheels 18a and 18b mounted on the lower surfaces of the wheel mounts 16a and 16b, respectively. The grinding wheels 18a and 18b have respective sets of grinding stones 20a and 20b on their lower surfaces for grinding wafers 1 held on the respective chuck tables 8 in the rough-grinding area and the finish-grinding area. The grinding wheels 18a and 18b are vertically movable respectively by processing feed units 24a and 24b mounted on the respective columns 22a and 22b.

The base 4 includes a front raised portion higher than a portion thereof where the turntable 6 is installed. A pair of cassette support tables (cassette support areas) 26a and 26b are fixedly mounted on the front end of the front raised portion of the base 4. The cassette support table 26a supports thereon a cassette 28a that houses therein wafers 1 to be ground, for example, and the cassette support table 26b supports thereon a cassette 28b that houses therein wafers 1 that have been ground, for example. A wafer delivery robot 30 is installed on the front raised portion of the base 4 adjacent to the cassette support tables 26a and 26b. On the front raised portion of the base 4, there are also disposed a positioning table 32 having a plurality of positioning pins, a wafer loading mechanism (wafer loading arm) 34, a wafer unloading mechanism (wafer unloading arm) 36, and a spinner cleaning apparatus 38 for cleaning and spin-drying a wafer 1 that has been ground.

The infrared camera unit 40 is disposed above the base 4 over a route along which a wafer 1 travels from the cassette 28a placed on the cassette support table 26a to the chuck table 8 in the wafer loading/unloading area. The infrared camera unit 40 applies an infrared radiation to the reverse side 1b of the wafer 1, catches an infrared radiation that has been transmitted through the wafer 1, and captures an image of the face side 1a of the wafer 1. Specifically, the infrared camera unit 40 is able to capture an image of the structural objects including the devices 5, etc. on the face side 1a of the wafer 1.

A control unit 42 of the grinding apparatus 2 will be described below. The control unit 42 is connected to various components of the grinding apparatus 2 and has a function to control those components. The control unit 42 has processing conditions, which have been input thereto in advance, for processing wafers 1 to be processed. The control unit 42 controls the components according to the processing conditions. The processing conditions include, for example, the diameters and thicknesses of wafers, the finished thicknesses of the processed wafers, the rotational speeds of the grinding wheels and the polishing pads, the rotational speeds of the chuck tables, the processing feed speeds, etc. The control unit 42 also has a function to determine whether a wafer 1 unloaded from the cassette 28a on the cassette support table 26a is a wafer 1 to be processed by the grinding apparatus 2 or not.

The control unit 42 includes a determining unit 42a for determining whether a wafer 1 to be determined is a wafer 1 to be processed or not, and an information register 42b that registers therein information on a pattern of structural objects such as devices 5, etc. which a wafer 1 to be processed is to have on its face side 1a. The information register 42b has a function to send the information to the determining unit 42a at the time the determining unit 42a determines.

Figure 2A:
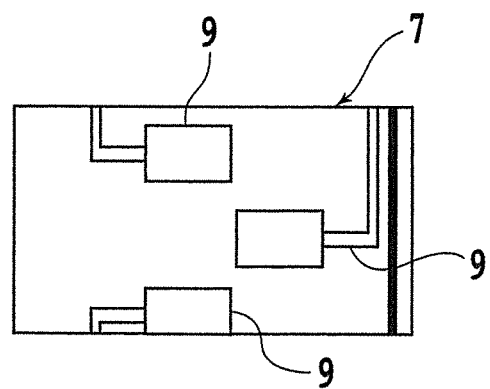
FIG. 2A is a plan view schematically depicting by way of example an image of structural objects registered as information in an information register.
Figure 2B:
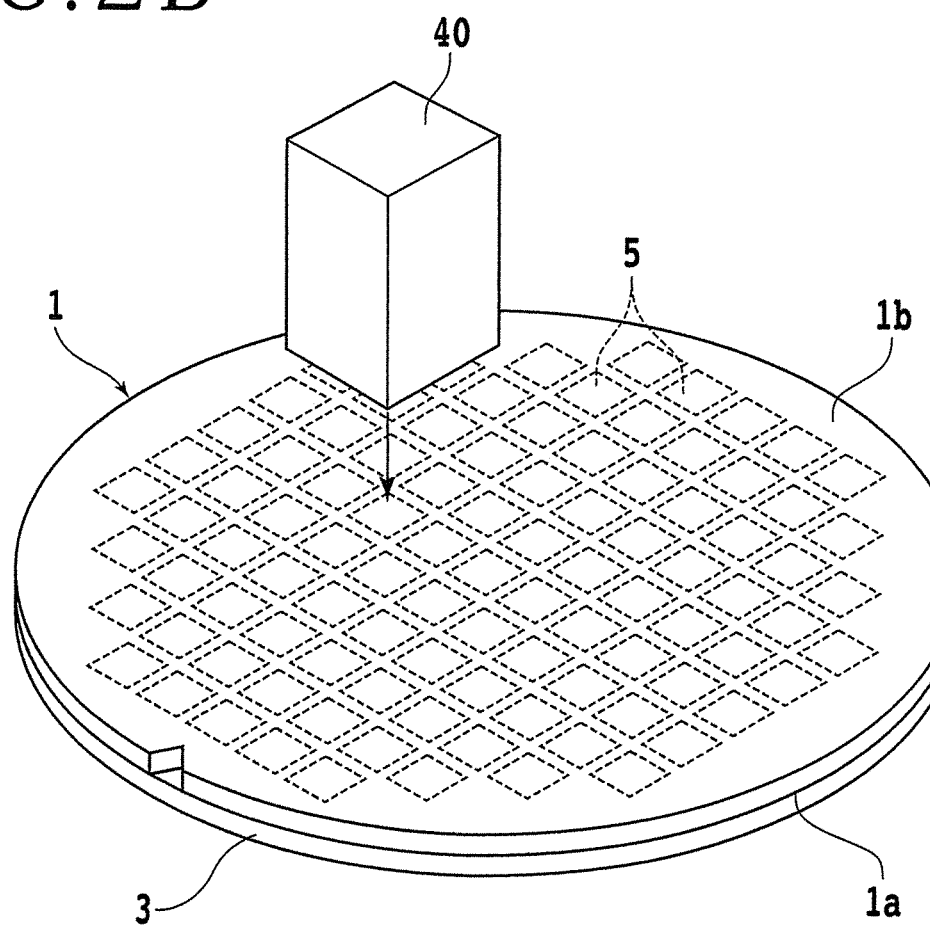
FIG. 2B is a perspective view schematically depicting the manner in which an image of the face side of a wafer is captured by an infrared camera unit.

The information registered in the information register 42b represents, for example, an image captured by the infrared camera unit 40 of a wafer 1 of a type to be processed. The image may be an image captured of a wafer 1 outside of the grinding apparatus 2 and sent to the information register 42b. FIG. 2A is a plan view schematically depicting by way of example an image 7 of structural objects registered as information in the information register 42b. The image 7 includes structural objects 9 such as devices, interconnects, electrodes, etc. The information register 42b may have images of face sides 1a of wafers 1 of various types registered in advance. In such a case, when the operator of the grinding apparatus 2 enters the type of a wafer 1 to be processed into the control unit 42, the type of the wafer 1 indicated by the image to be sent from the information register 42b to the determining unit 42a is determined. The information registered in the information register 42b may not be images. For example, the information registered in the information register 42b may be information on dimensions of characteristic portions of structural objects on the wafer 1 and design drawings of structural objects. As described above, the information on a pattern of structural objects which a wafer 1 to be processed is to have on its face side 1a represents various items of information that can be used to determine from an image captured by the infrared camera unit 40 whether the wafer 1 included in the image is a wafer 1 to be processed or not.

The determining unit 42a receives the information on the wafer 1 to be processed from the information register 42b at the time the determining unit 42a determines a wafer 1 to be processed. The determining unit 42a controls the infrared camera unit 40 to capture an image of the wafer 1 to be determined from the reverse side 1b thereof and acquire an image including the face side 1a of the wafer 1 to be determined. The determining unit 42a determines whether the acquired image including the face side 1a of the wafer 1 to be determined has a pattern of structural objects which a wafer 1 to be processed is to have on its face side 1a or not. If the determining unit 42a receives an image of the wafer 1 to be processed as information from the information register 42b, then the determining unit 42a compares the image received from the information register 42b and the image acquired from the infrared camera unit 40 with each other according to a process such as pattern matching or the like. If the compared images match each other, i.e., if a pattern of structural objects which a wafer 1 to be processed is to have is found on the wafer 1 to be determined, then the determining unit 42a determines that the wafer 1 to be determined is a wafer 1 to be processed. If the compared images match each other, i.e., if a pattern of structural objects which a wafer 1 to be processed is to have is not found on the wafer 1 to be determined, then the determining unit 42a determines that the wafer 1 to be determined is not a wafer 1 to be processed.

The grinding apparatus 2 further includes an indicating unit 44 connected to the determining unit 42a. The indicating unit 44 may be a warning lamp, a warning buzzer, or a display panel. The indicating unit 44 indicates the state or the like of the grinding apparatus 2 to the operator of the grinding apparatus 2. The indicating unit 44 has a function to indicate the determined result from the determining unit 42a. For example, if the determining unit 42a determines that the wafer 1 to be determined is a wafer 1 to be processed, then since the grinding units 10a and 10b can perform a grinding process, the indicating unit 44 indicates the determined result by not issuing a warning or the like. On the other hand, if the determining unit 42a determines that the wafer 1 to be determined is not a wafer 1 to be processed, then since no desired processed result will be obtained from a grinding process performed under the given processing conditions, the indicating unit 44 indicates the determined result by issuing a warning or the like.

For example, if the indicating unit 44 is a warning lamp, then the indicating unit 44 emits red light to issue a warning. If the indicating unit 44 is a warning buzzer, then the indicating unit 44 emits a buzzer sound to issue a warning. If the indicating unit 44 is a display panel, then the indicating unit 44 displays the determined result.

If the determining unit 42a determines that the wafer 1 to be determined is not a wafer 1 to be processed, then the grinding apparatus 2 does not perform a grinding process on the wafer 1, and delivers the wafer 1 to the cassette 28a on the cassette support table 26b, for example.

As described above, the grinding apparatus 2 according to the present embodiment includes the infrared camera unit 40 for capturing an image of the face side 1a of the wafer 1 to be determined and the control unit 42 that includes the determining unit 42a and the information register 42b. Therefore, the grinding apparatus 2 can determine whether the introduced wafer 1 is a wafer 1 to be processed or not, and can perform an appropriate grinding process under the given processing conditions.

A method of processing a wafer 1 which is to be carried out by the grinding apparatus 2 constructed as described above will be described below. First, the cassette 28a that houses wafers 1 therein is placed on the cassette support table 26a. Then, a wafer 1 in the cassette 28a is taken out and delivered by the wafer delivery robot 30 to the positioning table 32, by which the wafer 1 is placed in position. Thereafter, the wafer loading mechanism 34 places the wafer 1 on the chuck table 8 that is positioned in the wafer loading/unloading area. The above sequence from delivering the wafer 1 from the cassette 28a until placing the wafer 1 on the chuck table 8 will be referred to as a loading step. The wafer 1 housed in the cassette 28a has the protective tape 3 stuck to the face side 1a and the reverse side 1b or the face side 1a facing upwardly. If the face side 1a faces upwardly in the cassette 28a, then the wafer delivery robot 30 inverts the wafer 1 upside down before delivering the wafer 1 to the positioning table 32.

According to the method of processing the wafer 1, an image capturing step and a determining step are carried out during the loading step. The image capturing step may be carried out while the wafer 1 is being held by the wafer delivery robot 30 or while the wafer 1 is being placed on the positioning table 32. In the image capturing step, the infrared camera unit 40 captures an image of the wafer 1 from the reverse side 1b thereof and acquires an image including the face side 1a of the wafer 1 to be determined. In the image capturing step, the infrared camera unit 40 first captures an image of the face side 1a of the wafer 1 using a low-magnification lens capable of viewing the wafer 1 to be determined in a wide field of view, and grasps the general positional relationship between the structural objects on the face side 1a of the wafer 1. Then, using a high-magnification lens capable of viewing the structural objects clearly, instead of the low-magnification lens, the infrared camera unit 40 acquires an image depicting structural objects clearly in an area to be used in the determining step to be described below. The image capturing step may alternatively be carried out using a single lens only. If the infrared camera unit 40 captures an image of the face side 1a of the wafer 1 from the face side 1a, then there is a possibility that the protective tape 3 may obstruct an infrared radiation and the captured image may not include the structural objects on the face side 1a.

The image capturing step is followed by the determining step. In the determining step, the determining unit 42a acquires the image from the infrared camera unit 40 and extracts information on a wafer 1 to be processed from the information register 42b. The determining unit 42a determines whether the wafer 1 introduced in the loading step is a wafer 1 to be processed or not from the image and the information.

Figure 3A:
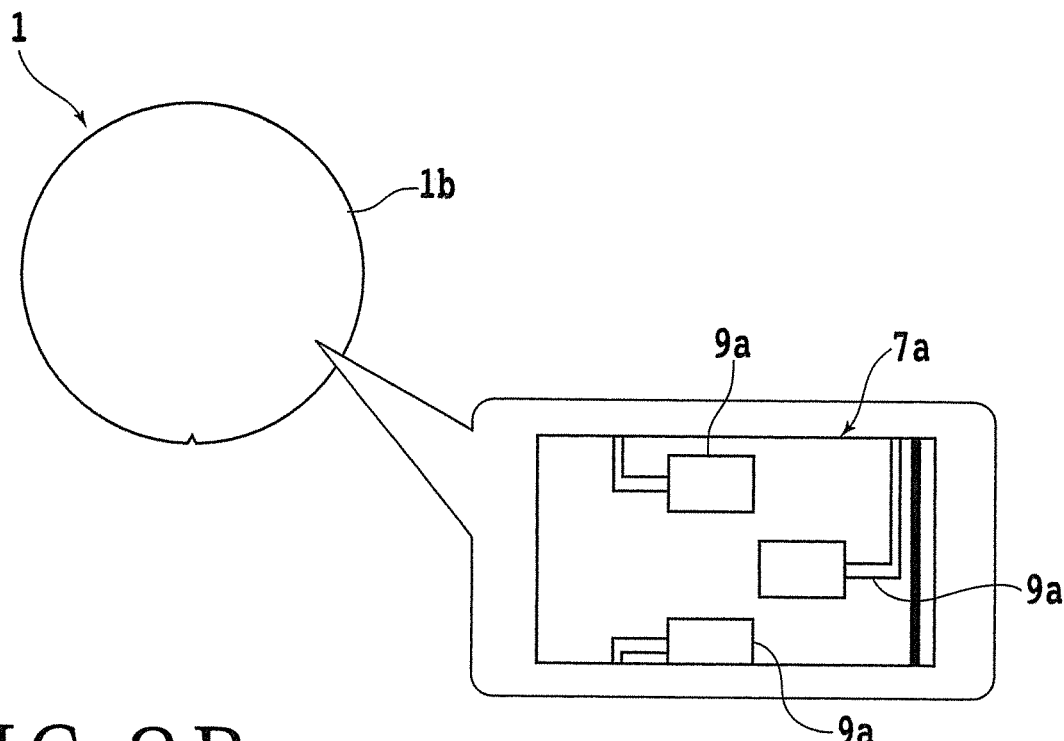
FIG. 3A is a view schematically depicting an example of an image captured by the infrared camera unit.
Figure 3B:
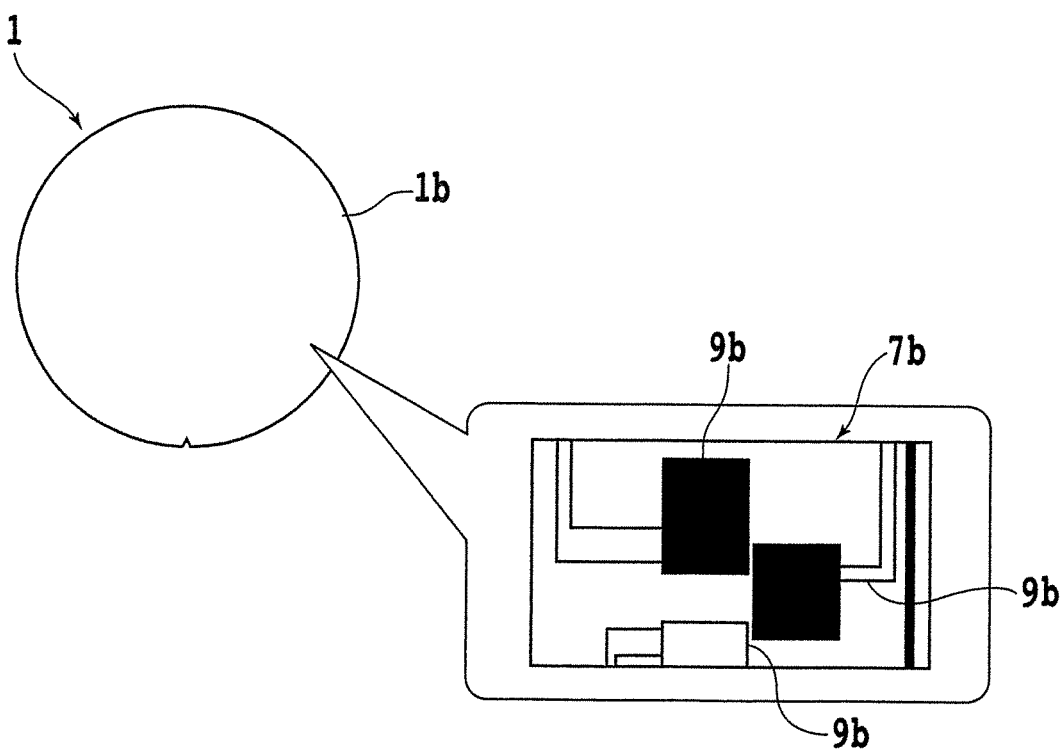
FIG. 3B is a view schematically depicting another example of an image captured by the infrared camera unit.

Examples of the determining step will be described below. FIG. 3A is a view schematically depicting an example of an image captured by the infrared camera unit 40. The information register 42b has the image 7 depicted in FIG. 2A registered therein. If the infrared camera unit 40 acquires an image 7a depicted in FIG. 3A, then since the pattern of structural objects 9 included in the image 7 matches the pattern of structural objects 9a included in the image 7a, the determining unit 42a determines that the introduced wafer 1 is a wafer 1 to be processed. FIG. 3B is a view schematically depicting another example of an image captured by the infrared camera unit 40. If the infrared camera unit 40 acquires an image 7b depicted in FIG. 3B, then since the pattern of structural objects 9 included in the image 7 registered in the information register 42b does not match the pattern of structural objects 9b included in the image 7b, the determining unit 42a determines that the introduced wafer 1 is not a wafer 1 to be processed.

The determining step is followed by an indicating step. In the indicating step, the indicating unit 44 indicates the determined result from the determining unit 42a. If the determining unit 42a determines that the wafer 1 introduced into the grinding apparatus 2 is a wafer 1 to be processed in the determining step, then a grinding step is carried out. In the grinding step, the introduced wafer 1 is held successively on the chuck tables 8 in the rough-grinding area and the finish-grinding area, where the wafer 1 is ground successively by the grinding units 10a and 10b.

According to the above processing method, the wafer 1 introduced into the grinding apparatus 2 is ground after it has been confirmed as a wafer 1 to be processed. Therefore, the wafer 1 can be processed under appropriate processing conditions, and the wafer 1 processed as desired is obtained.

The present invention is not limited to the embodiment described above, but various changes and modifications may be made therein. For example, the information register 42b of the grinding apparatus 2 may have, in addition to information on a pattern of structural objects which a wafer 1 to be processed is to have, processing conditions of a processing sequence to be performed on the wafer 1 to be processed, registered therein in association with the information on the pattern of structural objects. In such a case, if the determining unit 42a determines that the wafer 1 to be determined is a wafer 1 to be processed, the control unit 42 sends the processing conditions registered in the information register 42b in association with the information to the grinding units 10a and 10b. The grinding units 10a and 10b then perform grinding processes on the wafer 1 according to the processing conditions received from the control unit 42.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus for grinding or polishing a reverse side of a wafer which has structural objects on a face side thereof, the processing apparatus comprising:
    a chuck table holding the wafer with the face side facing downwardly;
    a processing unit grinding or polishing the reverse side, which is exposed upwardly, of the wafer held on the chuck table;
    a cassette support area supporting thereon a cassette housing the wafer therein;
    a delivery unit taking out the wafer from the cassette on the cassette support area and delivering the wafer to the chuck table;
    an infrared camera unit capturing an image of the reverse side of the wafer and acquiring an image of the face side of the wafer, wherein the image of the face side of the wafer includes a pattern of the structural objects, the structural objects including at least one of devices, interconnects and electrodes;
    an indicating unit indicating various items of information; and
    a control unit controlling the chuck table, the processing unit, the cassette support area, the delivery unit, the infrared camera unit, and the indicating unit,
    wherein the control unit includes:
    an information register registering a pattern of structural objects which a wafer to be processed is to have on the face side, and sending the registered pattern of structural objects to the determining unit,
        a determining unit that receives the registered pattern of structural objects from the information register, compares the image of the pattern of the structural objects with the registered pattern of structural objects and determines whether the wafer to be determined, which is taken out from the cassette on the cassette support area, is a wafer to be processed or not,
    wherein the infrared camera unit captures an image of the wafer to be determined before being processed by the processing unit from the reverse side thereof and acquires an image including the face side of the wafer, and if the pattern of structural objects which a wafer to be processed is to have on the face side is found in the acquired image, the determining unit determines that the wafer to be determined is a wafer to be processed, and if the pattern of structural objects which a wafer to be processed is to have on the face side is not found in the acquired image, the determining unit determines that the wafer to be determined is not a wafer to be processed, and
    wherein the indicating unit indicates the determined result from the determining unit.

2. The processing apparatus according to claim 1, wherein the infrared camera unit captures an image of the wafer to be determined over a route along which the wafer to be determined travels after being taken out of the cassette placed on the cassette support area until being held on the chuck table.

3. The processing apparatus according to claim 1, wherein the processing unit performs a pre-grinding process on the reverse side of the wafer prior to the infrared camera unit capturing the image of the reverse side of the wafer.

4. The processing apparatus according to claim 1, wherein the indicating unit includes a warning lamp, a warning buzzer or a display panel.

5. The processing apparatus according to claim 1, further comprising a turntable having three chuck tables, each of said chuck tables configured to hold the wafer.

6. The processing apparatus according to claim 1, further comprising a spinner cleaning apparatus configured for cleaning and spin-drying the wafer after grinding of the wafer.

* * * * *